(12) United States Patent
Huang

(10) Patent No.: US 6,380,042 B1
(45) Date of Patent: Apr. 30, 2002

(54) SELF-ALIGNED CONTACT PROCESS USING STACKED SPACERS

(75) Inventor: Shui-Chin Huang, Tainan (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/876,732

(22) Filed: Jun. 7, 2001

(30) Foreign Application Priority Data

Feb. 15, 2001 (KR) .......................................... 090103388

(51) Int. Cl.[7] .............................................. H01L 21/336
(52) U.S. Cl. ........................ 438/303; 438/306; 438/666
(58) Field of Search ................................ 438/299–307, 438/666

(56) References Cited

U.S. PATENT DOCUMENTS 6,225,176 B1 * 5/2001 Yu .............................. 438/305
6,281,862 B1 * 8/2001 Sanchez ..................... 438/303

* cited by examiner

*Primary Examiner*—Jey Tsai
(74) *Attorney, Agent, or Firm*—Ladas & Parry

(57) ABSTRACT

A self-aligned contact process is provided on a semiconductor substrate having at least two gate structures and a plurality of lightly ion-doped regions on the semiconductor substrate. Each of the gate structures has a gate layer and a cap layer formed on the gate layer. A first sidewall spacer is formed on the sidewalls of the gate structure, and then a heavy ion-doped region is formed on the exposed lightly ion-doped region. Next, a first dielectric layer is formed to fill the gap between adjacent first sidewall spacers. Part of the first sidewall spacer and part of the first dielectric layer is removed to expose the cap layer. A second spacer is then formed on the exposed sidewall of the cap layer. Next, a second dielectric layer is formed to fill the gap between adjacent second sidewall spacers. Finally, the second dielectric layer and the first dielectric layer positioned adjacent gate structures are removed to expose the second ion-doped region so as to form a contact hole.

16 Claims, 11 Drawing Sheets

SELF-ALIGNED CONTACT PROCESS USING STACKED SPACERS

BACKGROUND OF THE INVENTION

1. Field of the Invention

The present invention relates in general to a self-aligned contact process. In particular, the present invention relates to a self-aligned contact process using a nitride sidewall spacer stacked on an oxide sidewall spacer.

2. Description of the Related Art

The self-aligned contact (SAC) process is a powerful method used in semiconductor manufacturing, such as trench type DRAM, stacked DRAM, and FLASH memory, to reduce chip size by shortening the separation between adjacent polysilicon gates. In conventional SAC process, a sidewall spacer of the gate is used to define a lightly doped drain (LDD) structure, and also used to extend the oxide region at the gate edge and improve source/drain leakage property.

FIGS. 1A to 1F depict cross-sectional diagrams of prior art SAC process. Referring to FIG. 1A, a P-type silicon substrate 10 comprises a gate insulating layer 12, a plurality of gate structures 14 formed on the gate insulating layer 12, and a plurality of $N^-$-type ion-doped regions 16 formed surrounding the gate structure 14 on the substrate 10. Each of the gate structures 14 is stacked by a polysilicon layer 18 and a silicon nitride cap layer 20. Referring to FIG. 1B, a nitride ($Si_3N_4$) sidewall spacer 22 is formed on the sidewall of the gate structure 14, and then an $N^+$-type ion-doped region 24 is formed on the exposed $N^-$-type ion-doped region 16 using the gate structure 14 and the nitride sidewall spacer 22 as the mask. The $N^+$-type ion-doped region 24 serves as a source/drain region, and the remaining part of the $N^-$-type ion-doped region 16 serve as a LDD structure. Next, a barrier layer 26 made of silicon nitride is deposited to cover the entire surface of the substrate 10.

Referring to FIG. 1C, an inter-layered dielectric (ILD) 28 is deposited on the barrier layer 26 to fill the gap between adjacent gate structures 14. Then, a chemical-mechanical polishing (CMP) process is performed to level the surface of the ILD 28, as shown in FIG. 1D. Next, as shown in FIG. 1E, by using a patterned photo-resist layer (not shown) as a mask, the ILD 28 positioned between adjacent gate structures 14 is removed with the barrier layer 26 as an etching stop layer, resulting in an opening 29. However, in practical operation, the silicon nitride cap layer 20 and the nitride sidewall spacer 22 are over-etched, thus the profile of the opening 29 is shown as the dotted line. Finally, referring to FIG. 1F, the barrier layer 26 at the bottom of the opening 29 is removed to expose the $N^+$-type ion-doped region 24 between adjacent gate structures 14 so as to complete a contact hole 30.

According to the prior art SAC process, the sidewall spacer, for example the nitride sidewall spacer 22 covered on the gate structure 14, appears as a closed umbrella, not an opened umbrella, such as at least two sidewall spacers stacked on the gate structure. Also, the nitride sidewall spacer 22 covered on the gate structure 14 has the drawback of worsening the leakage problem. It may decrease the electric properties of an IC device, especially for FLASH memory products.

SUMMARY OF THE INVENTION

An object of the present invention is to provide a self-aligned contact process with stacked sidewall spacers to solve the leakage problem.

The self-aligned contact process of the present invention includes the steps: (a) providing a semiconductor substrate having at least two gate structures and a plurality of first ion-doped regions formed at opposite sides of the gate structures on the semiconductor substrate, each of the gate structures having a gate layer and a cap layer formed on the gate layer;

(b) forming a plurality of first sidewall spacers on the sidewalls of the gate structures respectively; (c) forming a plurality of second ion-doped regions on the exposed first ion-doped regions respectively, the depth and concentration of the second ion-doped region being greater than the depth and concentration of the first ion-doped region; (d) forming a first dielectric layer on the entire surface of the semiconductor substrate to fill the gap between adjacent first sidewall spacers; (e) removing the topmost portion of the first sidewall spacers and part of the first dielectric layer to expose each cap layer of the gate structures; (f) forming a plurality of second spacers on the exposed sidewalls of the cap layers respectively; (g) forming a second dielectric layer on the entire surface of the semiconductor substrate to fill the gap between adjacent second sidewall spacers; and (h) performing a dry etching process to remove the second dielectric layer and the first dielectric layer positioned between adjacent gate structures to expose the second ion-doped region so as to form a contact hole.

It is an advantage of the present invention that the first sidewall spacer and the second sidewall spacer stacked thereon, appears as an open umbrella. Also, the sidewall of the gate layer is only covered by the first sidewall spacer, preferably of silicon oxide, thus reducing the leakage phenomenon of the gate structure.

This and other objectives of the present invention will no doubt become obvious to those of ordinary skill in the art after having read the following detailed description of the preferred embodiment, which is illustrated in the various figures and drawings.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Figure 1A:
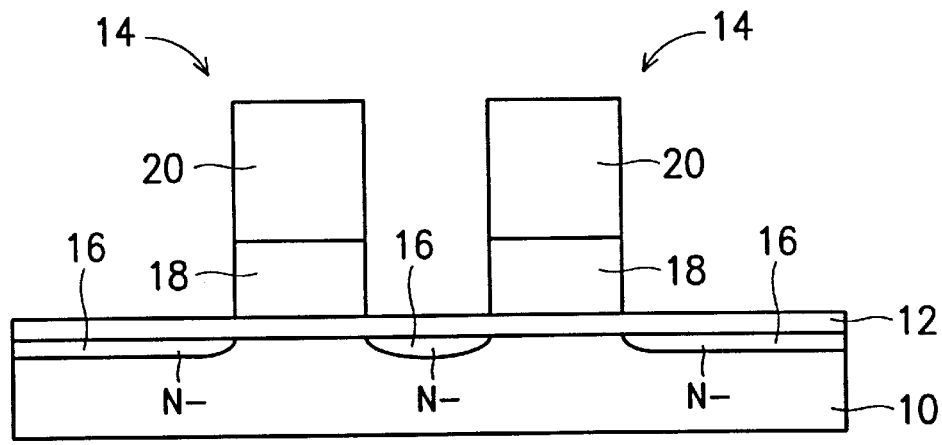
FIGS. 1A to 1F depict cross-sectional diagrams of prior art SAC process.
Figure 1B:
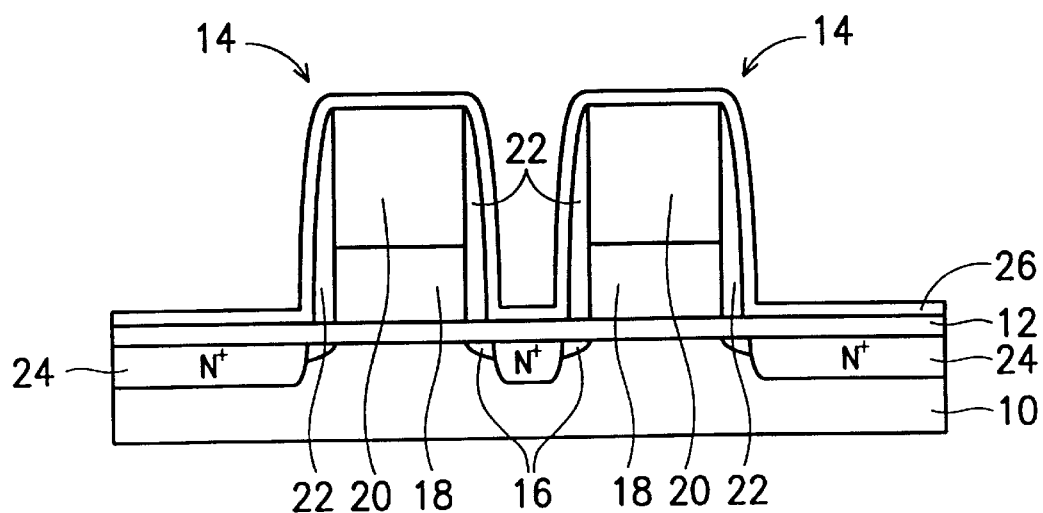
Figure 1C:
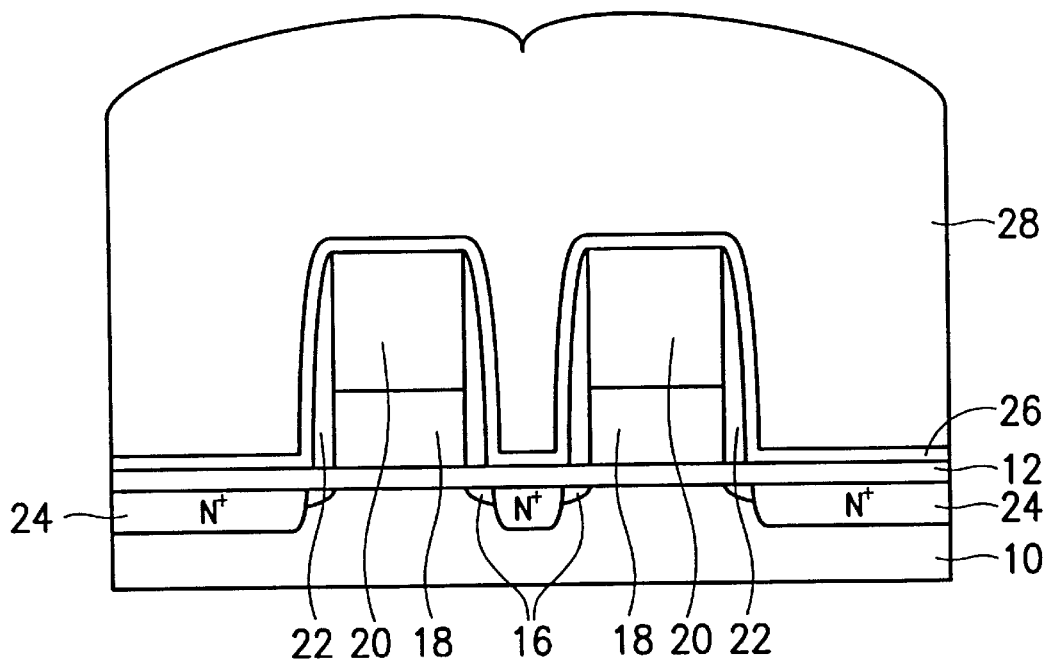
Figure 1D:
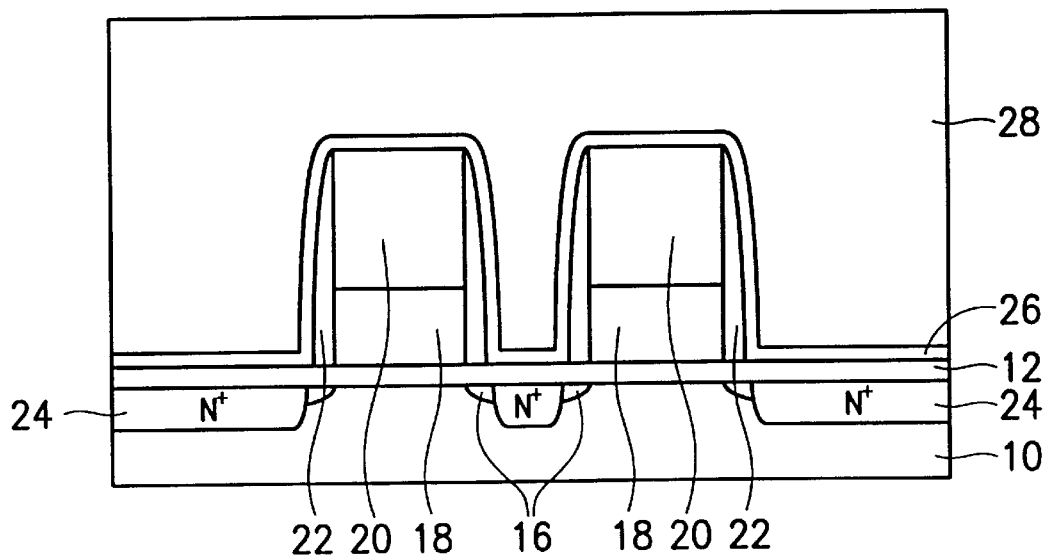
Figure 1E:
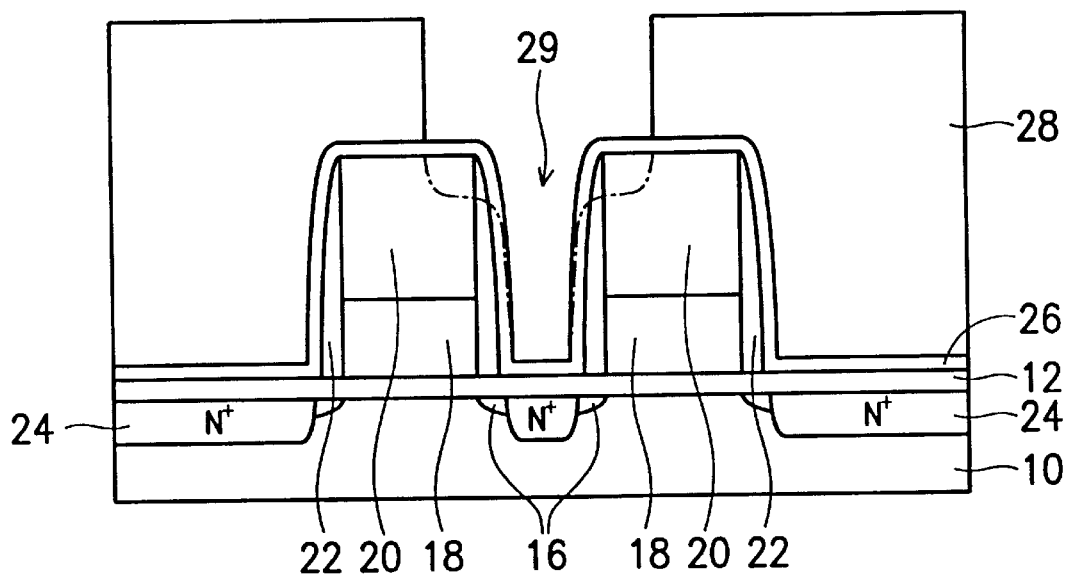
Figure 1F:
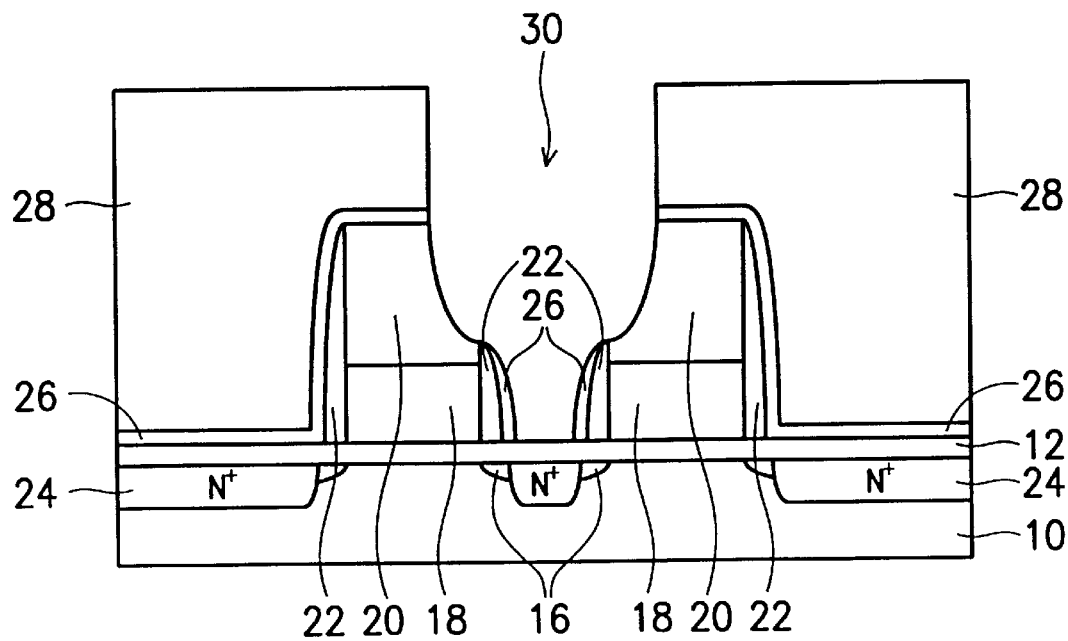
Figure 2A:
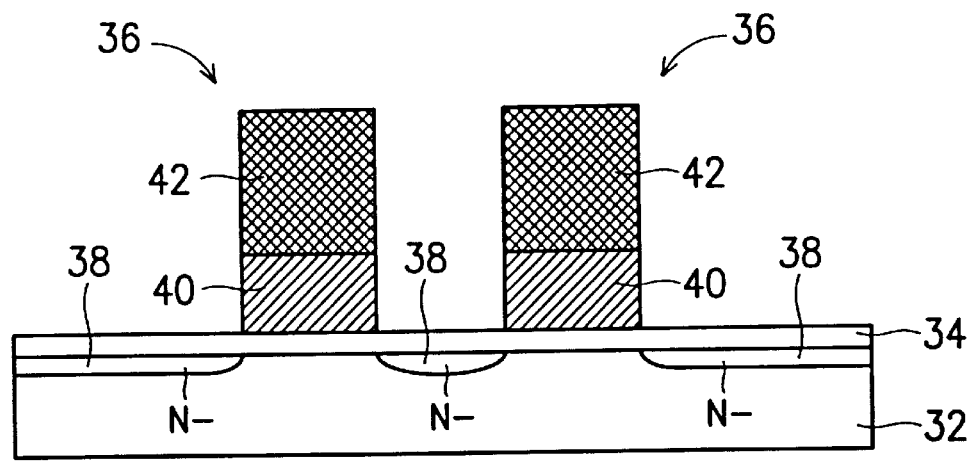
FIGS. 2A to 2L depict cross-sectional diagrams of the SAC process according to the first embodiment of the present invention.
Figure 2B:
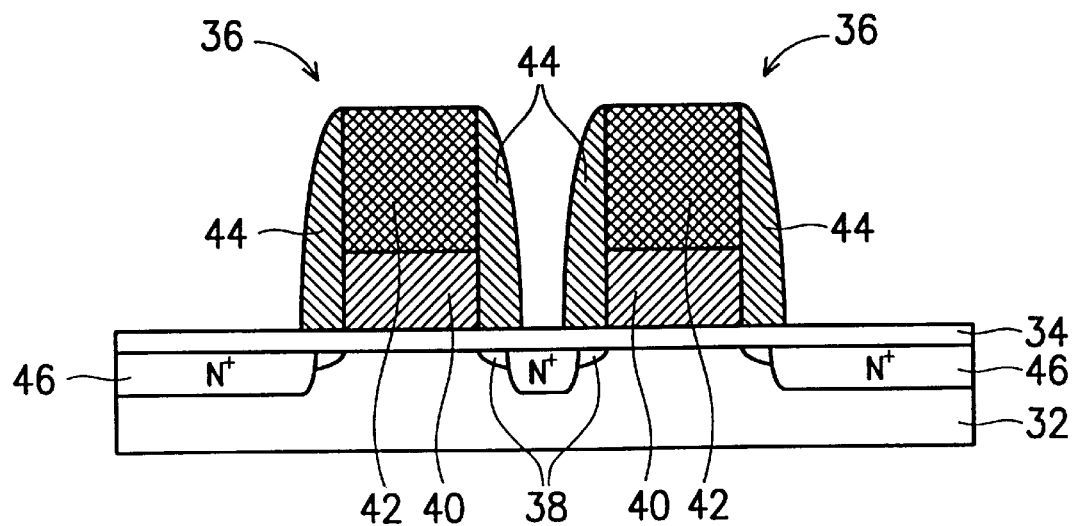

FIGS. 2A to 2L depict cross-sectional diagrams of the first embodiment of the SAC process according to the present invention. Referring to FIG. 2A, a P-type silicon substrate 32 comprises a gate insulating layer 34, a plurality of gate structures 36 formed on the gate insulating layer 34, and a plurality of N⁻-type ion-doped regions 38 formed at the opposite sides of gate structure 36 on the substrate 32. Each of the gate structures 36 is stacked by a polysilicon gate 40 and a silicon nitride cap layer 42. Referring to FIG. 2B, an oxide (SiO₂) sidewall spacer 44 is formed on the sidewall of the gate structure 36, and then an N⁺-type ion-doped region 46 is formed on the exposed N⁻-type ion-doped region 38 using the gate structure 36 and the oxide sidewall spacer 44 as the mask. The N⁺-type ion-doped region 46 serves as a source/drain region, and the remaining part of the N⁻-type ion-doped region 38 serve as a LDD structure.

Figure 2C:
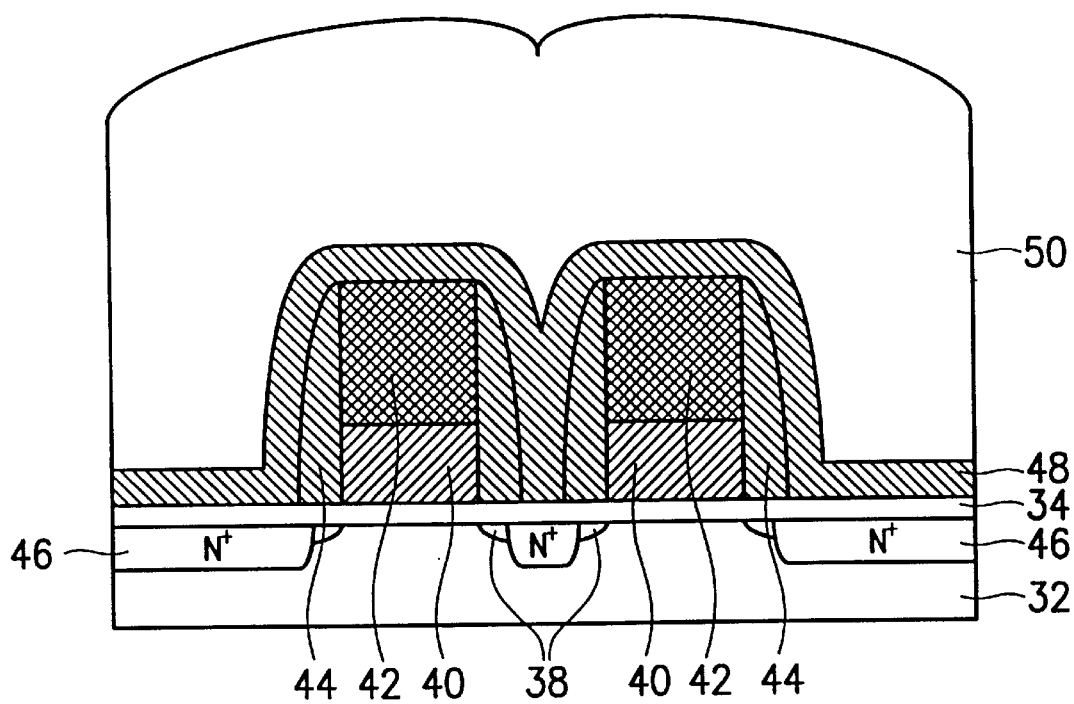
Figure 2D:
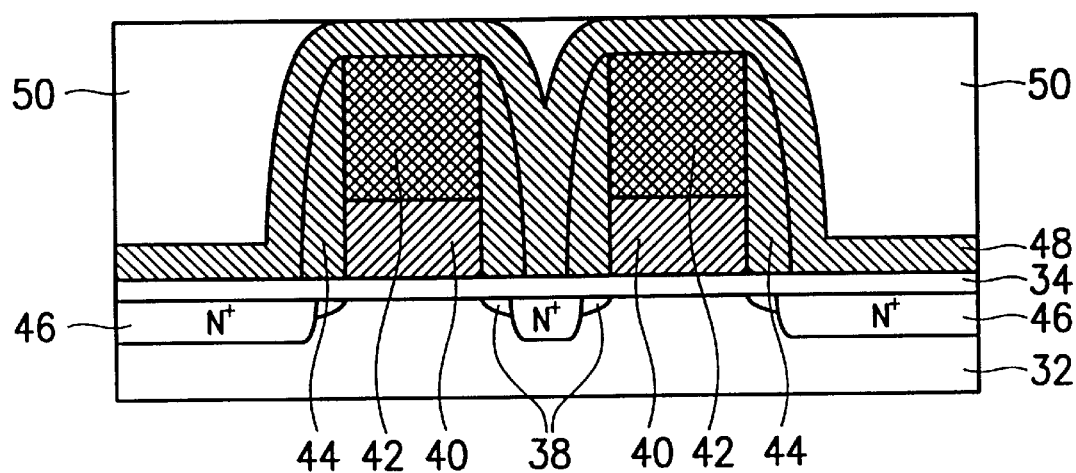
Figure 2E:
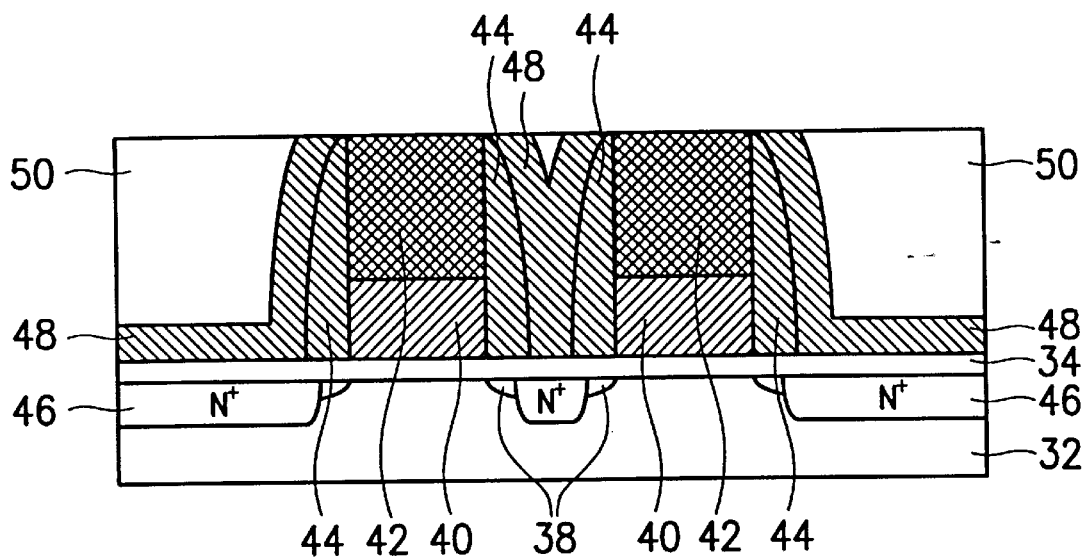
Figure 2F:
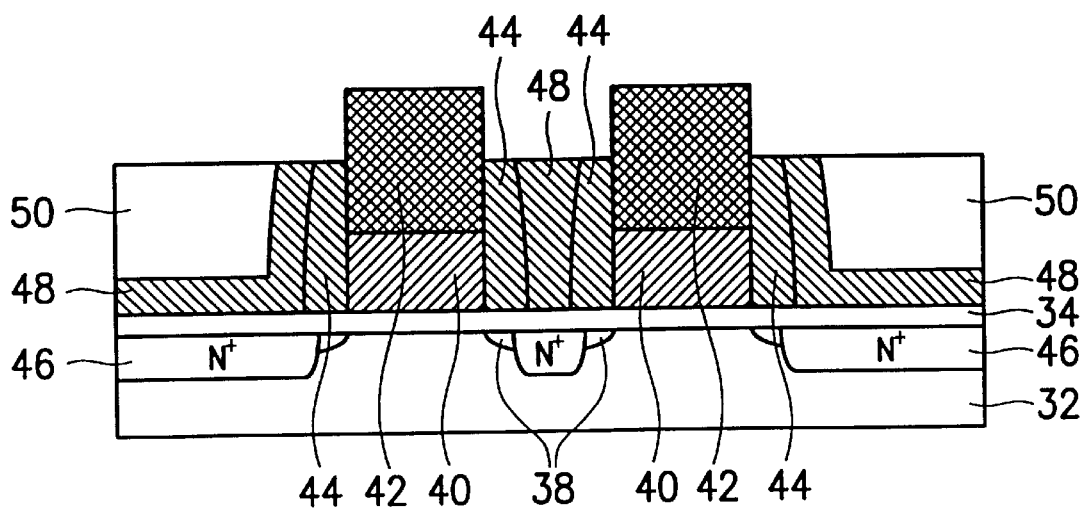

Referring to FIG. 2C, a barrier layer 48 of silicon oxide is deposited to cover the entire surface of the substrate 32 and fill the gap between adjacent gate structures 36. Then, a first inter-layered dielectric (ILD) 50 is deposited on the barrier layer 48. The first ILD 50 is preferably made of BPSG, HDP oxide or other dielectric materials that can achieve the demand of high etching selectivity between the first ILD 50 and the cap layer 42. Next, using the barrier layer 48 as an etching stop layer, the CMP process is performed on the first ILD 50 to level off the top surfaces of the first ILD 50 and the barrier layer 48, as shown in FIG. 2D. Thereafter, using the cap layer 42 as an etching stop layer, the CMP process is performed on the first ILD 50 to level off the top surfaces of the first ILD 50 and the cap layer 42, as shown in FIG. 2E. Afterward, as shown in FIG. 2F, an etching back process is performed to remove a predetermined thickness of the first ILD 50, the barrier layer 48 and the oxide sidewall spacer 44, thus part of the cap layer 42 is exposed and the remaining part of the oxide sidewall spacer 44 still covers the sidewall of the polysilicon gate 40.

Figure 2G:
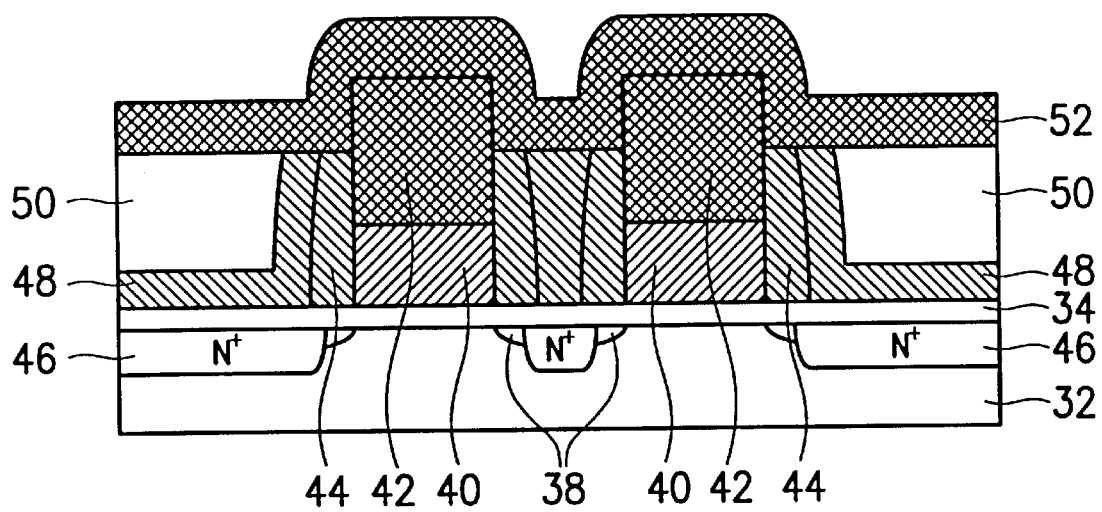
Figure 2H:
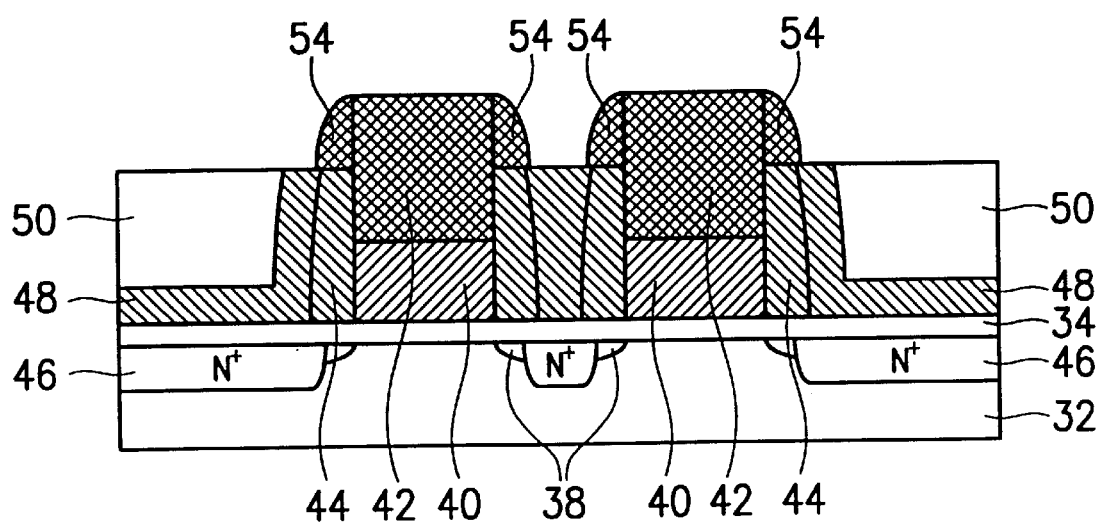
Figure 2I:
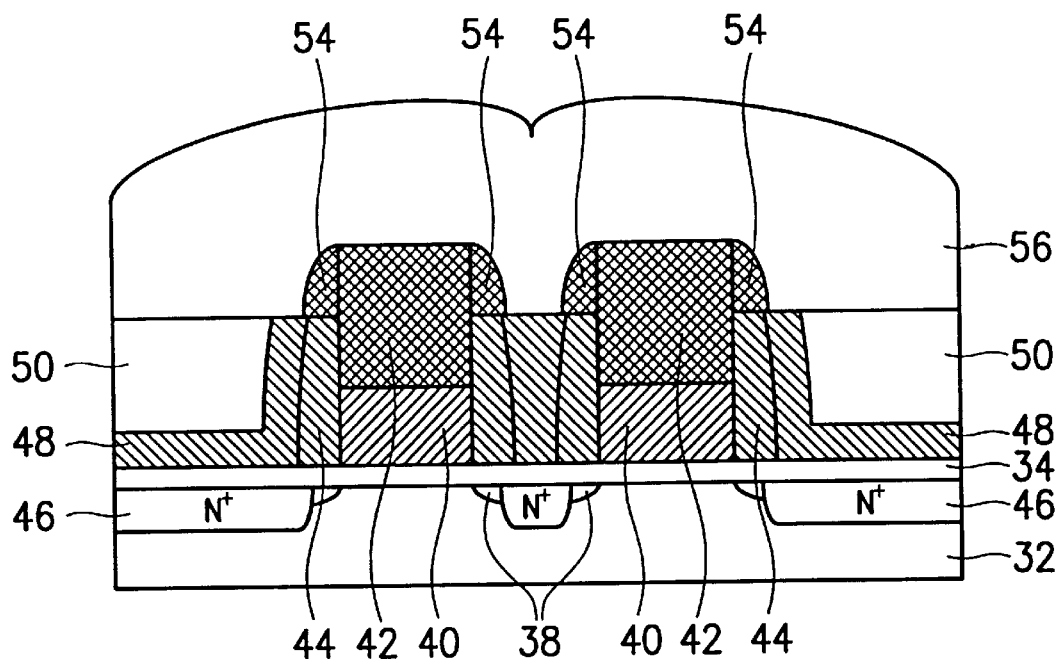
Figure 2J:
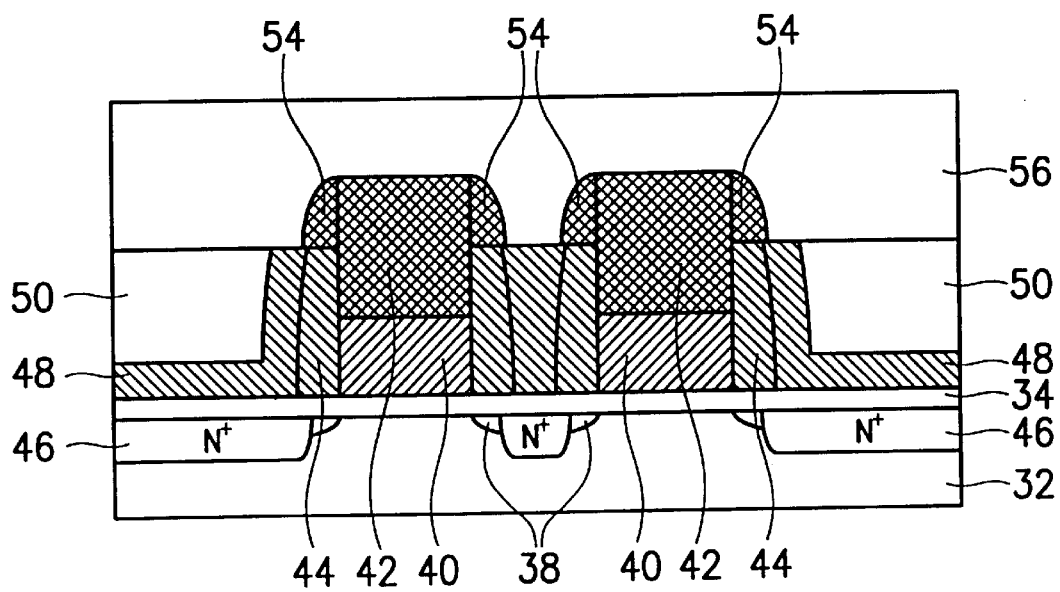

Referring to FIGS. 2G and 2H, by depositing a silicon nitride layer 52 and using an anisotropical dry etching method, a nitride sidewall spacer 54 is formed on the exposed sidewall of the cap layer 42. Then, as shown in FIG. 2I, a second ILD 56 is deposited on the entire surface of the substrate 32 to fill the gap between adjacent nitride sidewall spacers 54. Next, as shown in FIG. 2J, the CMP process is performed on the second ILD 56 to flatten the top surface of the second ILD 56.

Figure 2K:
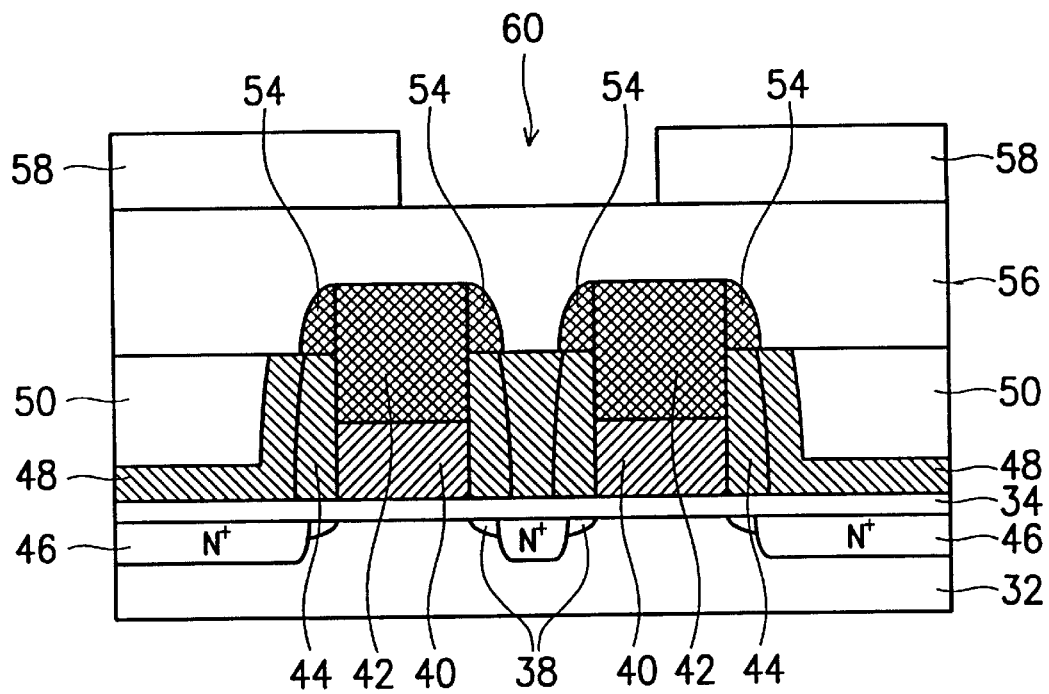
Figure 2L:
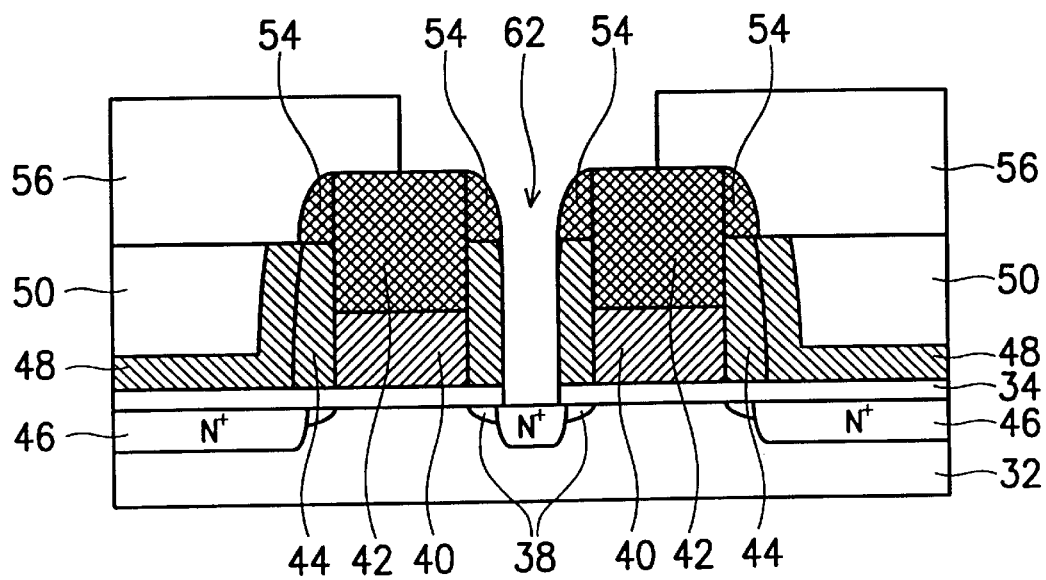

Referring to FIG. 2K, a patterned photo-resist layer 58, which has an opening 60 for patterning the contact hole, is formed on the second ILD 56. Then, as shown in FIG. 2L, the second ILD 56 and the barrier layer 48 positioned under the opening 60 is etched off to expose the N⁺-type ion-doped region 46 between adjacent gate structures 36, resulting in a contact hole 62. Finally, the patterned photo-resist layer 58 is stripped so as to complete the SAC process in the first embodiment of the present invention.

Compared with the prior art SAC process, in the SAC process of the present invention, the sidewall spacer of the gate structure 36, including the oxide sidewall spacer 44 and the nitride sidewall spacer 54 stacked thereon, appears as an open umbrella. Also, the sidewall of the polysilicon gate 40 is only covered by the oxide sidewall spacer 44, thus reducing the leakage of the polysilicon gate 40.

Figure 3:
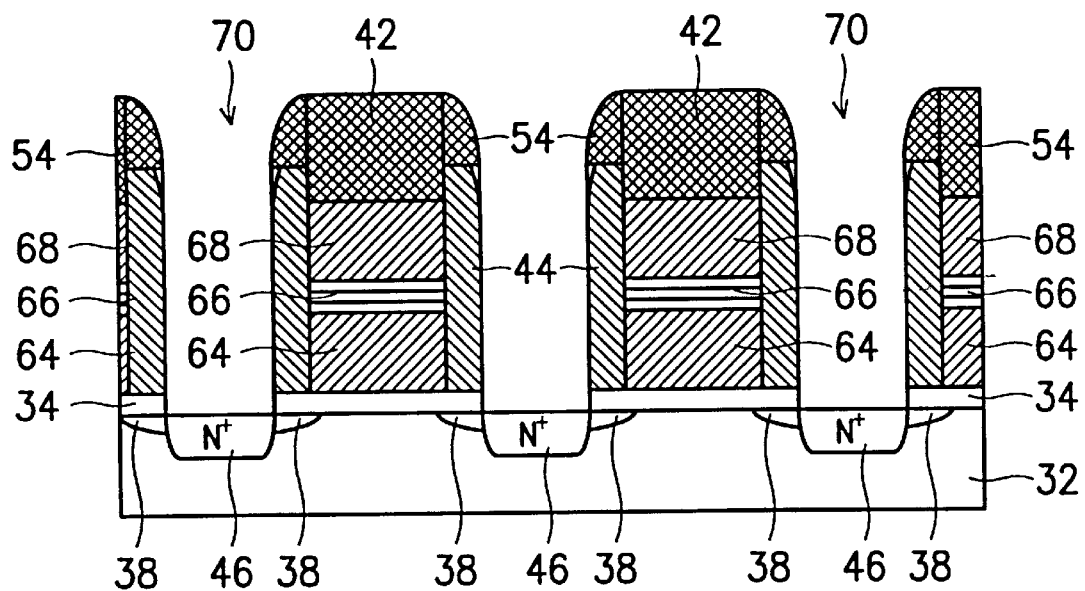
FIG. 3 is a cross-sectional diagram of a stacked gate structure of FLASH memory according to the SAC process in the second embodiment of the present invention.

Referring to FIG. 3, the SAC process is applied to the manufacturing of a stacked gate structure of FLASH memory in the second embodiment of the present invention. The stacked gate structure of FLASH memory is formed by a first gate 64, an ONO dielectric structure 66 and a second gate 68, and a contact hole 70 is formed between adjacent stacked gate structure to expose a contact region (the surface of the N⁺-type ion-doped region 46). According to the SAC process of the present invention, the oxide sidewall spacer 44 can completely cover the sidewall of the stacked gate structure, and the nitride sidewall spacer 54 only covers the sidewall of the cap layer 42. This reduces the leakage of the stacked gate structure.

Figure 4:
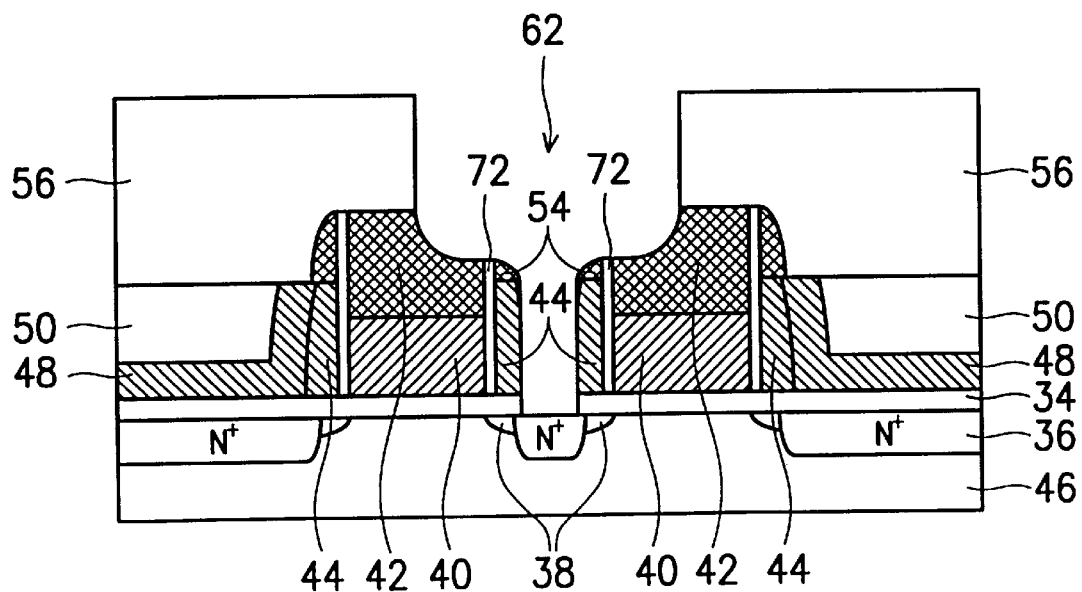
FIG. 4 is a cross-sectional diagram of the SAC process in the third embodiment of the present invention.
Figure 5:
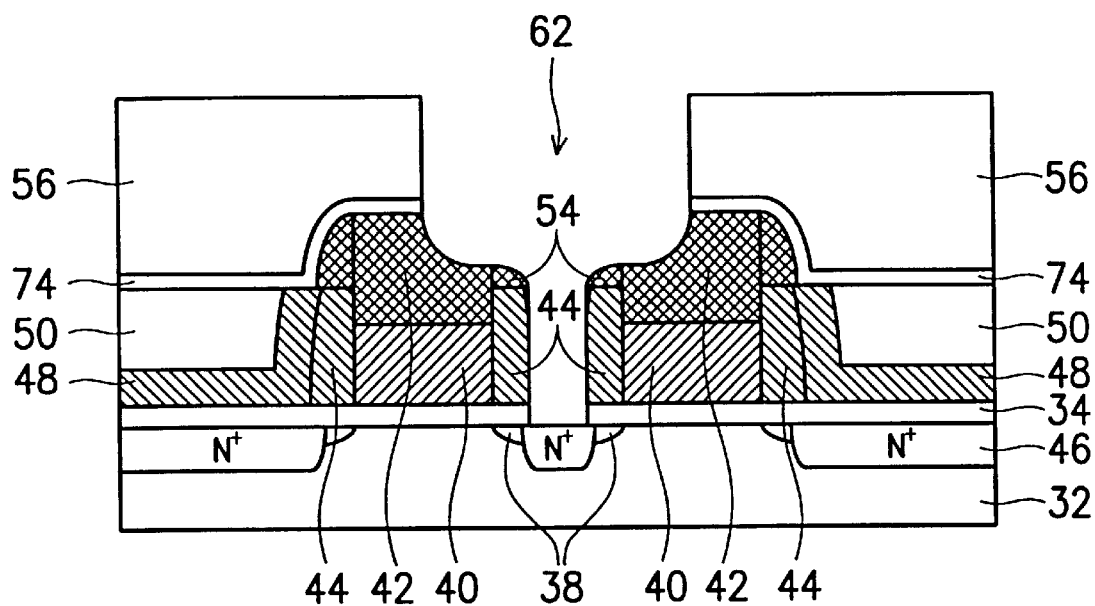
FIG. 5 is a cross-sectional diagram of the SAC process in the fourth embodiment of the present invention.

In addition, improving some steps of the SAC process in the first embodiment of the present invention further reduces the leakage problem. With respect to the first improvement, as shown in FIG. 4, a first shielding layer 72 of silicon oxide is formed on the gate structure 36 prior to the formation of the oxide sidewall spacer 44, thus separating the gate structure 36 and the oxide sidewall spacer 44/the nitride sidewall spacer 54 by the shielding layer 72. With respect to the second improvement, as shown in FIG. 5, a second shielding layer 74 of silicon nitride is deposited on the entire surface of the substrate 32 before the formation of the second ILD 56.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A self-aligned contact process, comprising the steps of:
   providing a semiconductor substrate having at least two gate structures and a plurality of first ion-doped regions formed at opposite sides of the gate structures on the semiconductor substrate, each of the gate structures having a gate layer and a cap layer formed on the gate layer;
   forming a plurality of first sidewall spacers on the sidewalls of the gate structures respectively;
   forming a plurality of second ion-doped regions on the exposed first ion-doped regions respectively, the depth and concentration of the second ion-doped region being greater than the depth and concentration of the first ion-doped region;
   forming a first dielectric layer on the entire surface of the semiconductor substrate to fill the gap between adjacent first sidewall spacers;
   removing the topmost portion of the first sidewall spacers and part of the first dielectric layer to expose each cap layer of the gate structures;
   forming a plurality of second spacers on the exposed sidewalls of the cap layers respectively;
   forming a second dielectric layer on the entire surface of the semiconductor substrate to fill the gap between adjacent second sidewall spacers; and
   performing a dry etching process to remove the second dielectric layer and the first dielectric layer positioned between adjacent gate structures to expose the second ion-doped region so as to form a contact hole.

2. The self-aligned contact process as claimed in claim 1, wherein the semiconductor substrate further comprises a gate insulating layer under the gate structures.

3. The self-aligned contact process as claimed in claim 1, wherein the cap layer is made of silicon nitride.

4. The self-aligned contact process as claimed in claim 1, wherein the gate structure is formed by stacking a first gate, a dielectric layer and a second gate.

5. The self-aligned contact process as claimed in claim 1, wherein after the formation of the second ion-doped regions on the exposed first ion-doped regions respectively, the retaining part of the first ion-doped region serves as a lightly doped drain (LDD) structure.

6. The self-aligned contact process as claimed in claim 1, wherein the second ion-doped region serves as a source/drain region.

7. The self-aligned contact process as claimed in claim 1, further comprising a step of forming a shielding layer made by silicon nitride on the sidewall of the gate structure before the formation of the first sidewall spacer.

8. The self-aligned contact process as claimed in claim 1, wherein the formation of the first dielectric layer comprises steps of:

forming a barrier layer on the entire surface of the semiconductor substrate to fill the gap between adjacent first sidewall spacers; and forming the first dielectric layer on the barrier layer.

9. The self-aligned contact process as claimed in claim 8, wherein the barrier layer is made by silicon oxide.

10. The self-aligned contact process as claimed in claim 8, wherein the first dielectric layer is made of BPSG.

11. The self-aligned contact process as claimed in claim 8, wherein the first dielectric layer is made by HDP oxide.

12. The self-aligned contact process as claimed in claim 8, wherein the step of removing the topmost portion of the first sidewall spacers and part of the first dielectric layer comprises:

performing a first chemical-mechanical polishing (CMP) process to level off the top surfaces of the first dielectric layer and the barrier layer;

performing a second CMP process to level off the top surfaces of the first dielectric layer and the cap layer; and performing an etching back process to remove a predetermined thickness of the first dielectric layer, the barrier layer and the first sidewall spacer so as to expose the cap layer.

13. The self-aligned contact process as claimed in claim 1, further comprising a step of forming a shielding layer of silicon nitride on the exposed surface of the gate structure and the second sidewall spacer before the formation of the second dielectric layer.

14. The self-aligned contact process as claimed in claim 1, wherein the step of removing the second dielectric layer and the first dielectric layer positioned between adjacent gate structures comprises:

forming a patterned photo-resist layer having an opening on the second dielectric layer; and performing the dry etching process to remove the second dielectric layer and the first dielectric layer under the opening so as to expose the second ion-doped region positioned between adjacent gate structures.

15. The self-aligned contact process as claimed in claim 1, wherein the first sidewall spacer is made of silicon oxide.

16. The self-aligned contact process as claimed in claim 1, wherein the second sidewall spacer is made of silicon nitride.

* * * * *

UNITED STATES PATENT AND TRADEMARK OFFICE
CERTIFICATE OF CORRECTION

PATENT NO.    : 6,380,042 B1
DATED         : April 30, 2002
INVENTOR(S)   : Shui-Chin Huang It is certified that error appears in the above-identified patent and that said Letters Patent is hereby corrected as shown below:

<u>Title page,</u>
Item [30], should read -- [30]    Foreign Application Priority Data
Feb. 15, 2001   (TW)………………....090103388 --

Signed and Sealed this

Fourth Day of February, 2003

JAMES E. ROGAN
*Director of the United States Patent and Trademark Office*